United States Patent
Schmid

(10) Patent No.: US 9,655,293 B2
(45) Date of Patent: May 16, 2017

(54) MOBILE ELECTRONIC DEVICE COMPRISING A MULTILAYER SAPPHIRE COVER PLATE

(71) Applicant: GTAT Corporation, Merrimack, NH (US)

(72) Inventor: Kurt Schmid, Marblehead, MA (US)

(73) Assignee: GTAT Corporation, Merrimack, NH (US)

( * ) Notice: Subject to any disclaimer, the term of this patent is extended or adjusted under 35 U.S.C. 154(b) by 0 days.

(21) Appl. No.: 14/100,838

(22) Filed: Dec. 9, 2013

(65) Prior Publication Data

US 2014/0162043 A1    Jun. 12, 2014

Related U.S. Application Data

(60) Provisional application No. 61/735,281, filed on Dec. 10, 2012.

(51) Int. Cl.
| | |
|---|---|
| *H05K 13/00* | (2006.01) |
| *B32B 17/06* | (2006.01) |
| *H04M 1/02* | (2006.01) |
| *B32B 7/12* | (2006.01) |

(52) U.S. Cl.
CPC .............. *H05K 13/00* (2013.01); *B32B 7/12* (2013.01); *B32B 17/06* (2013.01); *H04M 1/0266* (2013.01); *Y10T 29/49002* (2015.01); *Y10T 428/26* (2015.01)

(58) Field of Classification Search
CPC ........... G02B 1/10; B32B 17/00; B32B 17/06; C23C 14/00; Y10T 428/26; Y10T 29/49002; H04M 1/0266; H05K 13/00

USPC ......... 359/580–582, 586–590; 428/212–220, 428/426, 432–433, 688
See application file for complete search history.

(56) References Cited

U.S. PATENT DOCUMENTS

| | | | |
|---|---|---|---|
| 2006/0093834 A1* | 5/2006 | Lin | ........................ C30B 29/20 428/432 |
| 2008/0276990 A1* | 11/2008 | Zhou et al. | .................... 136/261 |
| 2011/0168261 A1 | 7/2011 | Welxer et al. | |
| 2011/0181549 A1* | 7/2011 | Hotelling | .............. G06F 3/0416 345/174 |
| 2012/0212890 A1 | 8/2012 | Hoshino et al. | |

(Continued)

FOREIGN PATENT DOCUMENTS

| | | |
|---|---|---|
| DE | 20210789 U1 | 9/2002 |
| JP | 09-008690 A | 1/1997 |
| JP | 09008690 A * | 1/1997 |

(Continued)

OTHER PUBLICATIONS

Machine Translation JP 09008690 A.*

(Continued)

*Primary Examiner* — Maria Veronica Ewald
*Assistant Examiner* — Travis Figg
(74) *Attorney, Agent, or Firm* — Parker Ibrahim & Berg LLC; Stephen D. LeBarron

(57) ABSTRACT

An electronic device comprising a cover plate is disclosed. The cover plate comprises one or more glass layers and one or more sapphire layers, wherein the layers are refractive index matched. Also disclosed are methods for preparing the electronic device.

12 Claims, 1 Drawing Sheet

(56) References Cited

U.S. PATENT DOCUMENTS

2014/0116329 A1† 5/2014 Chaudhari

FOREIGN PATENT DOCUMENTS

| KR | WO 2007089054 A1 * | 8/2007 | ....... B32B 17/10036 |
|----|--------------------|--------|----------------------|
| WO | WO 2007-089054 A1  | 8/2007 | |
| WO | WO-2009/008914 A2  | 1/2009 | |
| WO | WO2011-118524 A1   | 9/2011 | |
| WO | WO2012-100099 A2   | 7/2012 | |

OTHER PUBLICATIONS

Definition of Layer.*
Definition of Affixed.*
WO 2007089054 A1 translation.*
International Search Report dated Apr. 7, 2014 issued in connection with PCT/US/2013/073874.
European Search Report issued Sep. 14, 2016 in connection with European Application No. EP13861634.
Chaudhari, P. et al., Heteroepitaxial Silicon Film Growth at 600c from an Al—Si Eutectic Melt, pp. 5368-5371, 518, Jul. 30, 2010, Thin Solid Films, 518, USA.†

* cited by examiner
† cited by third party

MOBILE ELECTRONIC DEVICE COMPRISING A MULTILAYER SAPPHIRE COVER PLATE

CROSS-REFERENCE TO RELATED APPLICATION

This application claims the benefit of U.S. Provisional Application Ser. No. 61/735,281 filed Dec. 10, 2012, the teachings of which are incorporated herein by reference.

BACKGROUND OF THE INVENTION

1. Field of the Invention

The present invention relates to a mobile electronic device comprising a sapphire cover plate, particularly a cover plate comprising one or more layers of index matching glass on a layer of sapphire.

2. Description of the Related Art

There are many types of mobile electronic devices currently available which include a display window assembly that is at least partially transparent. These include, for example, handheld electronic devices such media players, mobile telephones (cell phones), personal data assistants (PDAs), pagers, tablets, and laptop computers and notebooks. The display screen assembly may include multiple component layers, such as, for example, a visual display layer such as a liquid crystal display (LCD), a touch sensitive layer for user input, and at least one outer cover layer used to protect the visual display. Each of these layers are typically laminated or bonded together.

Many of the mobile electronic devices used today are subjected to excessive mechanical and/or chemical damage, particularly from careless handling and/or dropping, from contact of the screen with items such as keys in a user's pocket or purse, or from frequent touch screen usage. For example, the touch screen surface and interfaces of smartphones and PDAs can become damaged by abrasions that scratch and pit the physical user interface, and these imperfections can act as stress concentration sites making the screen and/or underlying components more susceptible to fracture in the event of mechanical or other shock. Additionally, oil from the use's skin or other debris can coat the surface and may further facilitate the degradation of the device. Such abrasion and chemical action can cause a reduction in the visual clarity of the underlying electronic display components, thus potentially impeding the use and enjoyment of the device and limiting its lifetime.

Various methods and materials have been used in order to increase the durability of the display windows of mobile electronic devices. For example, polymeric coatings or layers can be applied to the touch screen surface in order to provide a barrier against degradation. However, such layers can interfere with the visual clarity of the underlying electronic display as well as interfere with the touch screen sensitivity. Furthermore, as the coating materials are often also soft, they can themselves become easily damaged, requiring periodic replacement or limiting the lifetime of the device.

Another common approach is to use more highly chemically and scratch resistant materials as the outer surface of the display window. For example, touch sensitive screens of some mobile devices may include a layer of chemically-strengthened alkali aluminosilicate glass, with potassium ions replacing sodium ions for enhanced hardness, such as the material referred to as "gorilla glass" available from Corning. However, even this type of glass can be scratched by many harder materials, including metal keys, sand, and pebbles, and, further, as a glass, is prone to brittle failure or shattering. Sapphire has also been suggested and used as a material for either the outer layer of the display assembly or as a separate protective sheet to be applied over the display window. However, sapphire is relatively expensive, particularly at the currently available thicknesses.

Thus, while materials are available which can enable the display of a mobile electronic device to be relatively resistant to damage, there remains a need in the industry for materials and methods for providing improved mechanical toughness and scratch resistance without reducing transmittance.

SUMMARY OF THE INVENTION

The present invention relates to an electronic device comprising a cover plate having at least one transparent display region. The cover plate comprises one or more glass layers having a refractive index $n_g$ and one or more sapphire layers having a refractive index $n_s$, wherein $(n_s-n_g)$ is not more than 0.05. Preferably $(n_s-n_g)$ is not more than 0.03, such as not more than 0.02, and more preferably the refractive index of the glass layer is substantially the same as the refractive index of the sapphire layer. The electronic device may further comprise at least one display element having a display surface, and the cover plate can be either affixed to the display surface or removably positioned on top of the display surface as a protective layer. Preferably, the sapphire layer is the front surface of the cover plate.

The present invention further relates to a method of preparing an electronic device comprising the steps of forming a cover plate having at least one transparent display region, wherein the cover plate comprises one or more glass layers having a refractive index $n_g$ and one or more sapphire layers having a refractive index $n_s$; and incorporating the cover plate onto a display element of the electronic device. For this embodiment, $(n_s-n_g)$ is not more than 0.05

It is to be understood that both the foregoing general description and the following detailed description are exemplary and explanatory only and are intended to provide further explanation of the present invention, as claimed.

DETAILED DESCRIPTION OF THE INVENTION

Figure 1:
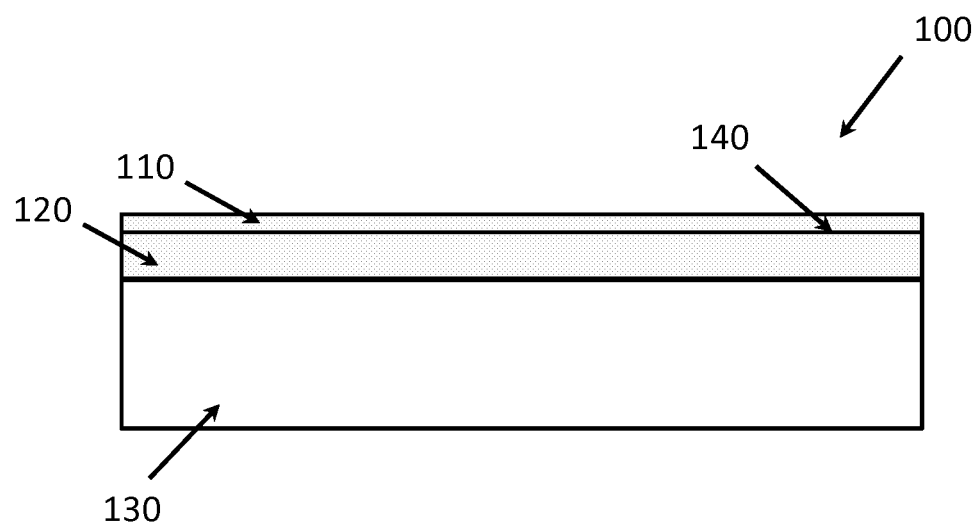
FIG. 1 and FIG. 2 are schematic views of specific embodiments of the electronic device of the present invention.

The present invention relates to an electronic device comprising a cover plate having multiple layers and methods to prepare the cover plate.

The electronic device of the present invention comprises a cover plate having at least one transparent display region through which an image can be displayed, such as from a display element upon which the cover plate is placed. Non-transparent regions may also be present, particularly as decorative elements such as borders or as elements to delineate various functional sections of the display. The electronic device can be any known in the art comprising a display or display element, such as mobile or portable electronic devices including, but not limited to, electronic media players for music and/or video, such as an mp3 player, mobile telephones (cell phones), personal data assistants (PDAs), pagers, laptop computers, or electronic notebooks or tablets. The display element of the device may include multiple component layers, including, for example, a visual display layer such as an LCD and a touch sensitive layer as part of a touch screen application. The cover plate can be affixed to the display surface of the display element of the device or it can be a separate protective layer that can be placed or positioned over or on top of the display element and later removed if desired.

The cover plate of the electronic device of the present invention comprises one or more sapphire layers and one or more glass layers. Thus, the cover plate is a multilayer composite of glass and sapphire layers, comprising, for example, 2-10 layers, such as 2-5 layers or 2-3 layers. Preferably, at least one of the glass layers is in direct contact with an outer surface of at least one of the sapphire layers. For example, the cover plate may comprise a glass layer affixed to the back surface of a sapphire layer. Preferably, the sapphire layer is the exterior layer of the cover plate and of the electronic device, although an antireflective and/or oleophobic coating may also be applied, typically having a thickness of from about 0.001 microns to about 1.5 microns. In addition, the cover plate may comprise two glass layers, each affixed to opposite surfaces of the sapphire layer, thereby forming a three-layer sandwich structure. Other combinations are also possible.

The glass layer may be applied to the appropriate surface of the sapphire layer using any technique known in the art. For example, the glass and sapphire layers may be combined using an adhesive, and any transparent adhesive or adhesive layer known in the art may be used. Examples of suitable adhesives include, but are not limited to, polymers or combinations of polymers such as poly(propylene carbonate) (PC), poly(ethylene carbonate) (PEC), or poly(butylenes carbonate) (PBC). Electrostatic adhesion may also be used. In addition, the glass layer may be fused or melted to the sapphire layer to form an interface, and the temperature required will depend on the type of materials used. For example, temperatures for melting a glass layer to the sapphire may be on the order of 650-1050° C. Alternatively, the sapphire layer may be coated with the glass. For example, a glass feedstock such as a powder frit, may be melted, and the resulting glass melt can be applied to the surface of the sapphire layer as a coating. The edges of the sapphire layer may also be coated. In addition, the sapphire layer may be dipped vertically (edge-on) into the molten glass to coat both sides of the sapphire layer or horizontally in order to apply the glass layer to one sapphire surface as well as to the edges of the sapphire layer.

The glass layer can be thicker or thinner than the sapphire layer, depending on a variety of factors. For example, a thinner glass layer may preferred when the differences in refractive index between the glass layer and the sapphire layer, discussed in more detail below, is high or when the glass has low resistant to cracking or shattering. In this case, the sapphire layer would enhance the properties of the glass layer. However, a thicker glass layer would be preferred to reduce the overall cost of the electronic device while maintaining the desirable bulk and surface properties of the sapphire layer, particularly when the sapphire layer is the exterior layer of the cover plate and electronic device. In either case, the composites preferably do not compromise the overall transparency of the cover plate.

Thus, the thickness of the glass layer and the sapphire layer can each vary depending on, for example, the type and size of the electronic device, the properties of the material in the layer, and the desired properties of the cover plate. For example, the thickness of the sapphire layer and/or the glass layer can be less than about 3 mm, such as from about 0.01 mm to about 3 mm, and is preferably less than about 2 mm, such as less than about 1 mm, less than about 0.5 mm, or less than about 0.1 mm. In addition, the sapphire layer may be an ultrathin sapphire layer, such as can be prepared from a sapphire donor using an ion implantation method, having a thickness of less than 50 microns, including, for example, less than 30 microns, less than 25 microns, less than 20 microns, or even less than 15 microns. Preferably, the sapphire layer is free-standing and is therefore able to be handled independently of a carrier layer.

The overall thickness of the cover plate of the electronic device of the present invention can also vary depending on a variety of factors, including, for example, the number of layers and the desired size and weight of the electronic device. In general, the multilayer cover plate has a thickness that is less than about 5 mm and preferably has a thickness of from about 0.3 mm to about 3.0 mm. However, since the cover plate of the present invention comprises sapphire and glass layers, the present cover plates can be thinner while, at the same time, achieving the desired level of rigidity and strength. Thus, for example, the cover plate more preferably has a thickness between about 0.4 mm to about 2.5 mm, even more preferably from about 0.5 mm to about 2.0 mm, and most preferably between about 0.5 mm and about 1.0 mm.

In the present invention, at least one of the glass layers and at least one of the sapphire layers of the cover plate are refractive index matched—that is, the difference in refractive index at room temperature of the glass and sapphire layers is small. Thus, if the glass layer has a refractive index of $n_g$ and the sapphire layer has a refractive index of $n_s$, $n_g$ is approximately equal to $n_g$. For example, preferably, $(n_s-n_g)$ is not more than about 0.05, including not more than about 0.03 and not more than about 0.02. Preferably, the glass layer has a refractive index that is substantially the same as that of the sapphire layer. This is particularly true when the glass layer is in direct contact with the sapphire layer. As a specific example, the refractive index of c-axis sapphire at room temperature is 1.795 to 1.761 for wavelengths in the visible range (350 to 750 microns). Thus, in the present invention, a glass layer affixed or coated onto this sapphire layer would have a refractive index between 1.845 and 1.711, preferably between 1.815 and 1.781, and more preferably between 1.805 and 1.751. The closer the match in refractive index, the thicker the glass layer can be.

The glass can be any known in the art having the desired relative refractive index. For example, a glass layer can comprise a soda-lime glass, a borosilicate glass, or an aluminosilicate glass, including a chemically-strengthened alkali aluminosilicate glass (such as the material referred to as "Gorilla glass" available from Corning). Preferably, in addition to the refractive index, the glass layer further has an appropriate thermal expansion coefficient which would achieve a compressive stress in the layer. This is particularly important when the glass layer is a coating on the sapphire layer. For example, for a glass coated sapphire layer, the glass layer can have a mean thermal expansion coefficient of from about $6.0 \times 10^{-6}$ °C.$^{-1}$ and $7.0 \times 10^{-6}$ °C.$^{-1}$. In this way, the glass layer can remain in compression across the sapphire layer, preventing the sapphire layer from damage due to cracking.

The sapphire layer of the cover sheet can be any known in the art and can be prepared using a variety of different methods. For example, the sapphire layer can be sawn or cut from a larger body of sapphire that has been prepared in a crystal growth apparatus, which is a high-temperature furnace capable of heating and melting a solid feedstock, such as alumina, in a crucible at temperatures generally greater than about 1000° C. and subsequently promoting resolidification of the resulting melted feedstock material to form a crystalline material, such as a sapphire boule. Preferably, the sapphire body is prepared in a heat exchanger method crystal growth furnace, in which a crucible comprising alumina feedstock and at least one single crystal sapphire seed is heated above its melting point to melt the feedstock without substantial melting of the seed, and the heat is then removed from the crucible using a heat exchanger, such as a helium-cooled heat exchanger, provided in thermal communication with the bottom of the crucible and positioned under the seed. This method has been shown to produce large, high quality sapphire bodies, sometimes referred to as boules, from which the sapphire layers can be removed.

The sapphire layer of the cover plate used in the electronic device of the present invention preferably has mechanical and physical properties similar to bulk sapphire. For example, at room temperature, the sapphire layer preferably has a flexural strength of at least about 700 MPA, including between about 800 and 1000 MPa, a fracture toughness (i.e., the ability of the material containing a crack or scratch to resist fracture) of greater than 1 MPa, including between about 2 and 5 MPa, a Knoop hardness of greater than about 15 GPa, including between about 17 and about 20 GPa, and/or a Vickers hardness of greater about 1000 kg/m, including between about 2000 and 3000 kg/m. The modulus, such as the Young's modulus, is also similar to the modulus of bulk sapphire, which is typically between about 300-400 GPa, but can vary depending on the desired properties of the cover plate (such as touch sensitivity).

As a specific example, an embodiment of the electronic device of the present invention, comprising a cover plate with a refractive index matched sapphire-glass multilayer composite, is shown schematically in FIG. 1. As shown, cover plate 100 comprises sapphire layer 110 and glass layer 120. Sapphire layer 110 is the exterior layer, with glass layer 120 being affixed to the back surface of sapphire layer 110. Cover plate 100 is positioned over display element 130, with glass layer 120 in contact with the display surface that produces an image seen by a user. In this example, the thickness of sapphire layer 110 is less than the thickness of glass layer 110, although, as discussed above, these thicknesses can be changed. As such, cover plate 100 would be expected to have the surface properties (such as scratch resistance) and mechanical properties (such as hardness) of sapphire, but at a significantly reduced cost. Furthermore, since the refractive index of glass layer 120 is substantially similar to that of sapphire layer 110, the images produced from display assembly 130 would be expected to be optically unaltered and clear.

A particular advantage of the embodiment shown in FIG. 1 is that the optical requirements of the back surface of sapphire layer 110, to which glass layer 120 is affixed, are significantly reduced. In particular, the roughness of the back surface can be higher since application of glass layer 120, having the specified refractive index, would be expected to fill in any voids or other non-uniformities without altering the optical performance, particularly if applied by dipping into molten glass. As a result, back surface 140 of sapphire layer 110 in contact with glass layer 120 does not need to be polished in order to provide the desired transparency. Thus, for example, sapphire layer 110 (sometimes referred to as a sapphire blank) can be laser cut or shaped from a sapphire body using techniques known in the art. The resulting cut surfaces and edges would be expected to be non-uniform and rough. However, by applying glass layer 120, which has been refractive index matched, to the back surface of sapphire layer 110, the roughness and imperfections of back surface 140 can be smoothed, and optical clarity can be restored. Thus, cover plate 100 can be prepared without the need to polish both surfaces of the sapphire, and this would represent a significant cost savings in the production of cover plates, thereby also reducing the cost of the electronic device. The surface of the glass layer would also preferably be polished in order to provide a cover plate having the desired overall transparency, as well as to provide proper contact with the display surface of the electronic device, but, as would be readily recognized by one skilled in the art, the cost to polish this glass coating would be very low compared to the cost for sapphire surface polishing, and throughput would also be considerably faster.

Figure 2:
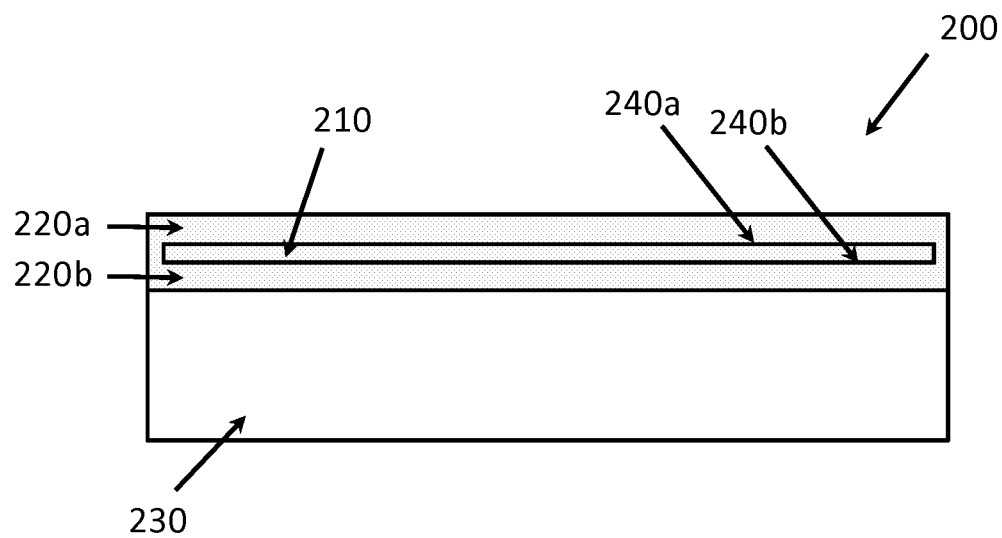

Furthermore, if a refractive-index matched glass layer is applied to both the front and back surfaces of sapphire layer 110, polishing of either sapphire surface would not be needed, providing additional cost savings. A specific example of this embodiment is shown schematically in FIG. 2. As shown, cover plate 200 comprises sapphire layer 210 and two glass layers, 220a and 220b. Cover plate 200 is positioned over display element 230, with glass layer 220b in contact with the display surface that produces an image seen by a user. Furthermore, in this example, the edges of sapphire layer 210 are also shown coated in glass, thereby surrounding sapphire layer 210, although this is not required. Since the refractive index of each of the two glass layers is substantially similar to that of sapphire layer 210, the images produced from display assembly 230 would be expected to be optically unaltered and clear. Furthermore, due to the presence these two glass layers applied to the sapphire layer, cover plate 200 can be prepared without the need to polish either front surface 240a or back surface 240b of sapphire layer 210, and this would represent a significant cost savings in the production of cover plates. In addition, application of the glass to the edges would be expected to also enhance the strength of the sapphire layer as microvoids and cracks would be coated by the glass, thereby minimizing the potential for point defect failures. As discussed above, the glass surface or surfaces would also preferably be polished in order to provide a cover plate having the desired overall properties.

Thus, the present invention further relates to a method of producing an electronic device comprising a cover plate having at least one sapphire layer. The method comprises the steps of forming a cover plate having at least one transparent display region, wherein the cover plate comprises one or more glass layers having a refractive index $n_g$ and one or more sapphire layers having a refractive index $n_s$, wherein $(n_s - n_g)$ is not more than 0.05; and subsequently incorporating the cover plate onto a display element of the electronic device. Any of the cover plates described above can be used in this method. Preferably, the sapphire layer is exterior layer of the cover plate. The cover plate can be formed by affixing the glass layer to the back surface of the sapphire layer using any of the techniques described above. In one embodiment, the method of the present invention does not comprise the step of polishing the back surface of the sapphire layer, to which the glass layer is affixed such as by coating, but further comprises the step of polishing the front surface, opposite the back surface, which can be the surface in which a user will interact. In a second embodiment, in which the cover plate comprises two glass layers affixed to opposite surfaces of the sapphire layer, the method does not comprise polishing surfaces of the sapphire layer. Preferably, the method further comprises the step of polishing the exterior surface of the glass layer or layers.

The foregoing description of preferred embodiments of the present invention has been presented for the purposes of illustration and description. It is not intended to be exhaustive or to limit the invention to the precise form disclosed. Modifications and variations are possible in light of the above teachings, or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An electronic display device comprising:
at least one display element having a display surface; and
a cover plate having at least one transparent display region, the cover plate comprising a glass layer having a refractive index $n_g$ and one or more free standing sapphire layers having a refractive index $n_s$, wherein $(n_s-n_g)$ is not more than 0.05, wherein the cover plate is directly affixed to the display surface to operate as a touch screen,
wherein the sapphire layer has a back surface, and the glass layer is directly coated to the back surface of the sapphire layer.

2. The electronic device of claim 1, wherein (ns−ng) is not more than 0.03.

3. The electronic device of claim 1, wherein (ns−ng) is not more than 0.02.

4. The electronic device of claim 1, wherein the refractive index of the glass layer is substantially the same as the refractive index of the sapphire layer.

5. The electronic device of claim 1, wherein the sapphire layer has a thickness of less than about 2 mm.

6. The electronic device of claim 1, wherein the cover plate has thickness between about 0.3 mm and 3.0 mm.

7. The electronic device of claim 1, wherein the cover plate has thickness between about 0.5 mm and 1.0 mm.

8. The electronic device of claim 1, wherein the sapphire layer is an exterior layer of the cover plate.

9. The electronic device of claim 1, wherein the cover plate is a protective layer removably positioned on top of the display surface.

10. The electronic device of claim 1, where the back surface of the sapphire layer is unpolished.

11. The electronic device of claim 1, wherein the cover plate comprises two glass layers each affixed to opposite surfaces of the sapphire layer.

12. The electronic device, of claim 1, wherein the electronic device is an electronic media player, a mobile telephone, a personal data assistant, a pager, a tablet, a laptop computer, or an electronic notebook.

* * * * *